United States Patent [19]

Lubowitz et al.

[11] 3,914,334

[45] Oct. 21, 1975

[54] FLEXIBLE ELECTRICAL INSULATING POLYMERIC SHEET

[75] Inventors: Hyman R. Lubowitz, Hawthorne; Harry Raech, Jr., Torrance, both of Calif.

[73] Assignee: TRW Inc., Redondo Beach, Calif.

[22] Filed: July 31, 1974

[21] Appl. No.: 493,294

[52] U.S. Cl........ 260/836; 117/124 E; 117/132 BE; 117/138.8 F; 156/3; 156/278; 161/186; 260/837 R

[51] Int. Cl.$^2$........................................ C08L 63/00

[58] Field of Search............................ 260/836, 837

[56] References Cited

UNITED STATES PATENTS

| | | | |
|---|---|---|---|
| 3,515,772 | 6/1970 | Lubowitz | 260/836 |
| 3,616,193 | 10/1971 | Lubowitz | 260/836 |
| 3,655,818 | 4/1972 | McGown | 260/836 |
| 3,678,130 | 7/1972 | Klapprott | 260/836 |
| 3,678,131 | 7/1972 | Klapprott | 260/836 |
| 3,686,359 | 8/1972 | Soldatos | 260/836 |
| 3,707,583 | 12/1972 | McGown | 260/836 |
| 3,753,755 | 8/1973 | Olson | 260/836 |
| 3,853,815 | 12/1974 | Lubowitz | 260/836 |
| 3,855,176 | 12/1974 | Skidmore | 260/836 |

*Primary Examiner*—Paul Lieberman
*Attorney, Agent, or Firm*—Daniel T. Anderson; Alan D. Akers; Willie Krawitz

[57] ABSTRACT

An economical, high-performance flexible electrical insulating sheet is made by coating a thermosetting polybutadiene-epoxy-nitrile resin mixture onto the surface of a sheet of reinforcing fibrous material and curing the resin mixture to form a tough flexible resinous laminate. Where tear strength is not so important, the resin may be made into a self-supporting film without the inclusion of reinforcing materials. Because of its high dielectric strength, the flexible electrical insulating sheet may be used as a covering or as a substrate for flexible printed circuits. Where the flexible laminate is to be used as a printed circuit substrate, the fiber filled resin mixture is coated onto a thin metal foil and cured to form a tough flexible laminate, or in the alternative, the fiber filled resin mixture is cured in sheet form and metal coated by electroless plating. Photoresist materials applied to the metal foil surface render the laminate subject to the state-of-the-art printed circuit etching processes. Printed circuit boards can be fabricated by applying a layer of polybutadiene-epoxy-nitrile adhesive to the etched circuit pattern sheets, stacking the sheets, and thermally curing the adhesive. Alternatively, the flexible printed circuit sheets may be rolled and inserted in tubular connectors.

3 Claims, No Drawings

FLEXIBLE ELECTRICAL INSULATING POLYMERIC SHEET

BACKGROUND OF THE INVENTION

Films or sheets of electrical insulating resins have been made primarily from polyesters, such as "Mylar," or polyimides, such as "Kapton," which were chosen for their strength, thermal stability, and dielectric properties. Where printed circuits are made, selected circuit sheets may be employed singly or stacked in layers and cured under heat and pressure. In the alternative, either polyesters or polyimdes readily lend themselves to flexing without catastrophic failure, and therefore, they are suitable for use as single sheet flexible circuits.

Even though the polyesters and the polyimides exhibit many satisfactory properties for use in printed circuits, there are several disadvantages which the present invention overcomes. Among the disadvantages encountered with the use of polyimide films are the cost of the film and the adhesives used to bond the polyimide to other surfaces, e.g. metal foils. Presently, polyimide films are expensive in comparison to many other commercially available films, and because of the difficulties encountered in adhering polyimides to other surfaces, unusual adhesive techniques must be employed. While these factors render polyimide-foil circuit sheets expensive, the cost is justified where high temperatures are encountered. Polyesters, on the other hand, are less expensive than the polyimide films, however, the adhesive used to bond the polyester sheet to other surfaces frequently diminishes the thermal stability and dielectric properties of the polyester. In addition to this disadvantage, polyester films tend to distort at temperatures encountered during soldering, if such is required for an electrical connection.

The resin used in this invention is a multi-component polymer comprising a polybutadiene-epoxy resin blended with a nitrile rubber. The nitrile rubbers used herein are commercially available and generally comprise a copolymer of 16% to 50% by weight of acrylonitrile, with the median about 32% and the remainder consisting of butadiene.

SUMMARY OF THE INVENTION

Flexible electrical insulating sheets are made by coating a thermosetting mixture of polybutadiene-epoxy-nitrile rubber onto a sheet of fibrous reinforcing material. Where the tear strength is relatively unimportant, the resin can be made into a self-supporting film without the reinforcing fibers. The thermosetting mixture can be cured to a tought, flexible film or sheet by heating in the presence of an organic peroxide. Preparation of the polybutadiene-epoxy-nitrile resin comprises mixing 5% to 10% by weight of a butadiene-acrylonitrile rubber with 95% to 90% by weight of a mixture of the ratio of approximately one equivalent of 1,2-polybutadienediol homopolymer, approximately one gram mole of an organic acid anhydride, and approximately 1 to 1.2 equivalents of epoxy resin. This resin mixture is cured to form a block polymer by heat in the presence of 2% to 10% by weight of peroxide based on the polybutadiene present.

The resin sheets or films may be reinforced by the inclusion of fibrous materials. Fibrous materials which are synthetic organic or inorganic may be used in a woven or an unwoven form.

A thin metal foil appled to the surface of the resin film or sheet can be used to make printed circuits. Circuit patterns can be etched according to known processes.

Other uses for the flexible sheets and films of this invention arise where electrical insulating wraps or coverings are required.

DESCRIPTION OF THE PREFERRED EMBODIMENTS

Flexible electrically insulating sheets according to this invention are prepared by mixing 1,2-polybutadienediol, an organic acid anhydride, an epoxy polymer, a carboxy terminated butadiene-acrylonitrile copolymer, and an organic peroxide together, and curing the mixture by heat. The resin is formulated to provide reaction of approximately 5% to 10% by weight of the butadiene-acrylonitrile copolymer with 95% to 90% by weight of a mixture having a ratio of approximately one equivalent of 1,2-polybutadienediol homopolymer, approximately one gram mole of an organic acid anhydride, and approximately 1 to 1.2 equivalents of an epoxy resin. The resin mixture is cured to form a block polymer by heat in the presence of 2% to 10% by weight of peroxide based on the polybutadiene present.

The polybutadiene homopolymer employed in this invention should have a microstructure consisting of at least 50% 1,2-isomer, and preferably at least 80% of the 1,2-isomer. The molecular weight of the polybutadiene homopolymer should range from 1,000 to 10,000, but preferably from 1,000 to about 4,000. It is speculated that the 1,2-polybutadiene crosslinks and cyclizes under the influence of the peroxide when heated.

In addition, the 1,2-polybutadiene homopolymer should contain a terminal hydroxyl substituent on each end of the polymer chain. Ideally, the functionality of the polybutadiene should be 2, so as to give, theoretically, one hydroxyl group on each end. Statistically and practically, a functionality ranging up from 1.4 has been found to be suitable. Generally, processing difficulties arise when the functionality of the polybutadiene is below 1.4, whereas functionalities above 2 are less economical.

The preferred carboxyl terminated butadiene-acrylonitrile copolymer suitable for use in this invention can be obtained from the B. F. Goodrich Corporation. The copolymer has an average molecular weight in a range of from about 3,000 to 34,000 with 3,200 preferred, and having a Brookfield viscosity of 120,000 ± 25,000 centipoise at 27°C. Carboxyl groups constitute 0.055 ± 0.006 parts per hundred of the rubber to give a functionality of approximatey 1.8. The amount of bound acrylonitrile in this copolymer is 18.2 ± 2 percent.

The structure of the polymeric resin used in this invention is believed to comprise a 1,2-polybutadiene which has been end capped by reaction with the diol substituents to produce a 1,2-polybutadiene having a dicarboxylic end cap substituent. The dicarboxylic end capped 1,2-polybutadiene and the carboxylic acid terminated butadiene-acrylonitrile copolymer react with the epoxy polymer to form the backbone block polymer chain. Upon curing in the presence of the peroxide the polybutadiene in the backbone crosslinks and cyclizes to produce a flexible thermoset resin having excellent physical and chemical properties.

Although any aromatic acid anhydride can be used which will react with the terminal hydroxyl substituent on the 1,2-polybutadiene, a few examples of suitable aromatic acid anhydrides are:

TABLE I

| |
|---|
| trimellitic anhydride |
| tetrahydrophthalic anhydride |
| hexahydrophthalic anhydride |
| chlorendic anhydride |
| nadic anhydride |
| phthalic anhydride |
| methyl nadic anhydride |
| 3,3',4,4'-benzophenone tetracarboxylic dianhydride |
| pyromellitic dianhydride |
| pyromellitic dianhydride-glycol adducts |

In order to impart more satisfactory flexible properties to the cured resin sheets, the rigid aromatic epoxy resin chain extender can be modified by partially replacing the aromatic epoxy with a flexible aliphatic epoxy resin. It has been found that up to about 50% by weight of the aromatic epoxy can be replaced with the aliphatic epoxy, and preferably about 10% to 30% by weight of the aromatic epoxy can be substituted by the aliphatic type.

Although any epoxy resin can be used which will react with the acid substituent resulting from the anhydride, suitable examples of some of the epoxide chain extenders include the following:

TABLE II

| |
|---|
| epoxy novalacs |
| bis-epoxydicyclopentyl ether of ethylene glycol |
| epichlorohydrin/bis-phenol A-type |
| 1-epoxyethyl-3,4-epoxycyclohexane |
| dicyclopentadiene dioxide |
| limonene dioxide |
| bis(2,3-epoxypropoxy)benzene |
| vinylcyclohexane dioxide |
| 3,4-epoxy-6-methylcyclohexylmethyl-3,4-epoxy-6-methylcyclohexanecarboxylate |
| zeaxanthin diepoxide |
| 9,10-epoxy-12-hydroxyoctadecanoic acid triester with glycerol |
| diglycidyl ether of disphenol A |

Where fire resistance is important, brominated epoxy resins may be used.

The organic peroxide in this invention acts as a free radical initiator. Upon the application of heat, the peroxide decomposes and initiates the cyclization and crosslinking of the polybutadiene pendant vinyl groups.

The organic peroxide can be incorporated into the resin mixture during initial mixing. When the mixture is exposed to temperatures ranging from room temperature to approximately 95°C, the prepolymers react through the functional end groups to chain extend into an elastomeric block macromolecule having the peroxide homogeneously dispersed therethrough. Alternatively, the peroxide can be milled into the elastomeric block polymer after chain extension, if desired. Upon exposure to temperatures ranging from 130°C to 300°C, the peroxide free radical initiator is activated to cure the elastomeric staged resin to a tough flexible polymer.

Suitable organic peroxide free radical initiators may be selected from the following:

TABLE III

| |
|---|
| di-t-butyl peroxide |
| 2,5-dimethyl-2-5-bis(tertiary butylperoxy)hexane |
| n-butyl-4,4-bis(tertiary butylperoxy) valerate |
| 2,5-dimethyl-2,5-bis(tertiary butylperoxy)hexnye-3 |
| tertiary-butyl perbenzoate |
| dicumyl peroxide |
| methyl ethyl ketone peroxide |
| cumene hydroperoxide |
| di-N-methyl-t-butyl percarbamate |
| lauroyl peroxide |
| acetyl peroxide |
| decanoyl peroxide |
| t-butyl peracetate |
| t-butyl peroxyisobutyrate |

To improve the tear strength of these resin films, fibrous materials are mixed into the resin. The fibrous material may be woven or nonwoven and selected from natural organic, synthetic organic, or inorganic materials. Natural organic fibers are not especially desirable because they exhibit a high moisture pick-up and poor chemical resistance, both of which detract from dielectric values. Inorganic fibers, such as fiber glass, and synthetic organic fibers, such as polyesters, polyimides, polyamides, or acrylics are preferred.

Flexible electrically insulating laminates according to this invention can be produced by coating or impregnating a sheet of fibrous reinforcing material or by incorporating the fibers into the initial prepolymer mix. Production of the fiber-resin mix into sheet form may be accomplished in any of the known procedures. The cured flexible sheets have high dielectric properties which make them well suited for coatings or wrappings of electrical components where a high quality of insulation is required.

One application in which the present fiber-resin material is especially well adapted is as a substrate for flexible printed circuits. There are three ways of producing flexible printed circuit stock sheets. In one method, the elastomeric resin-fiber sheet is bonded to the denticulated side of a metal foil which may be cured subsequently to produce a resin-backed foil. Good bonds are obtained by applying 20 to 200 psi pressure for 1 to 5 minutes at 175° to 200°C. Alternatively, a thin coating of the fiber-polybutadiene-epoxy-nitrile resin can be coated onto an expendable metal foil and cured to produce a sheet of resin backed foil. Subsequently, the foil can be dissolved in a mineral acid, such as hydrochloric, sulfuric, or nitric acids, or a caustic solution, such as sodium hydroxide, leaving a thin sheet of the resin which can be applied then to an etched printed circuit foil. Still a third way of producing flexible printed circuit stock sheets is to coat copper or other suitable metal onto the cured resin sheet by electroless deposition. This can be done by any of the known techniques.

Treated electrolytically deposited metal foils, preferably copper foil, of a type especially made for the purpose of this invention, are manufactured by Clevite Corporation, Materials Technology Corporation, and Yates Industries. These foils are manufactured in weights of one-half to three ounces per square foot, and range in thickness from 0.001 – 0.005 inches. Proprietary chemical treatments are applied to the denticulated side of the foil by the manufacturer in order to promote adhesion of the plastic substrate. The liquid polybutadiene-epoxy-nitrile resin mixture may be applied to the metal foil in thicknesses ranging from 0.005 to 0.003 inches, or the mixture may be dissolved in a solvent such as toluol, methyl ethyl ketone, or acetone and applied as a varnish to the metal foil. The resin may be applied using any state of the art apparatus.

After the resin is applied to the metal foil, the resin is reacted to form an elastomeric stage. The elastomer forms by a chain extending reaction when the film is allowed to stand at room temperature or is slightly warmed for 1 to 10 minutes at 80° to 95°C. Final cure of the resin is effected by heating the sheet to temperatures in the range of 130° to 300°C for 1 to 5 minutes. Usually, the resin is chain extended and cured simultaneously as this invention is practiced.

The printed circuit pattern is applied photographically, usually. In this process a photoresist is applied to the metal foil. The photoresist may be either in film or liquid form. Resist resins are photopolymers, such as diallyl metaphthalate, polyvinyl alcohol, or cinnamic acid ester of polyvinyl alcohol which includes suitable sensitizers and peroxide. The circuit pattern is a negative on film and is applied to the sensitized surface by exposure with a high intensity light which polymerizes the exposed photoresist. In this fashion, the metal areas intended to remain as circuits are covered with a polymerized layer of photorersist, while the balance of the metal is coated with unpolymerized resist. This unpolymerized resist is washed off with solvent and the plate dried. Automatic equipment is used to process the circuits and typical processing time is about 2 minutes.

After the unpolymerized photoresist has been removed, the laminate is washed in a chemical etchant. The chemical etchant removes the unprotected foil to produce the precision metal circuit bonded to the resin backing. Subsequently, the etchant is flushed off with de-ionized water, and the circuit is dried. Typical chemical etchants may be selected from chromic acid, ferric chloride, ammonium persulfate, or any of several other alkali strip solutions. The final step of stripping the polymerized photoresist from the remaining metal circuit pattern readies the circuit pattern for fabrication into a printed circuit board.

Resins, according to this invention, exhibit a tenacious bond with aluminum, copper, silver, gold, nickel, platinum, chromium, tungsten, and many other conductive structural metals. Copper is preferred for most applications of this invention because it offers the best balance between electrical properties and economics.

The following example is presented to provide a better understanding of the flexible electrical laminates according to the present invention.

EXAMPLE I

Approximately 20.4 gms of dihydroxy-1,2-polybutadiene having approximately 80% vinyl unsaturation and a calculated molecular weight of 1,000, approximately 4.6 gms of anhydride, approximately 9.1 gms of brominated epoxy novolac, approximately 8.5 gms of glycidyl ether of glycerol, approximately 3.1 gms of butadiene-acrylonitrile copolymer, approximately 2.35 gms of dicumyl peroxide, and approximately 221 parts of tetrahydrofuran were placed in a glass vessel and mixed for approximately 5 minutes at room temperature. The mixture is coated onto a sheet of nonwoven fabric of polyethylene terphthalate and heated in an oven for 7 minutes at 105°C whereby an elastomeric sheet is formed. A flexible printed circuit sheet stock is made by placing the elastomeric sheet on a sheet of release paper and placing a sheet of copper foil on top of the elastomeric sheet with the denticulated side next to the elastomeric sheet. The paper-elastomer-foil sandwich is placed between two press pads which, in turn, are placed between two caul plates, and the entire arrangement is placed under 200 psi pressure at about 190°C for 2 minutes. A copper foil-resin substrate laminated sheet was produced in which the copper foil was uniformly and tenaciously bonded to the resin-fiber substrate.

EXAMPLE II

To produce a self-supporting non-reinforced film, the liquid resin mixture described in Example I is coated onto a thin aluminum foil and heated to approximately 75°C to remove the tetrahydrofuran solvent. The laminate is heated then to a temperature of about 135°C for 7 minutes, and finally cured at 200°C for 2 minutes. The laminate is immersed in a 10% solution of sodium hydroxide to dissolve the aluminum foil, and subsequently the resin film is washed and dried.

This last example is particularly adaptable to a continuous production process.

We claim:

1. A flexible electrically insulating polymeric sheet comprising:

A. 90% to 95% by weight of polybutadiene-epoxy elastomeric resin having an organic peroxide homogeneously dispersed therethrough and having a ratio of
   - i. one equivalent of hydroxy terminated polybutadiene homopolymer consisting essentially of at least 50% of 1,2-polybutadienediol,
   - ii. one gram mole of an aromatic acid anhydride,
   - iii. 1 to 1.2 equivalents of a polyfunctional epoxy resin; and B. 10% to 5% by weight of a dicarboxy terminated butadieneacrylonitrile copolymer comprising 16% to 50% by weight acrylonitrile and the balance butadiene and having an average molecular weight between about 3,000 and about 34,000.

2. A flexible sheet according to claim 1 wherein said polyfunctional epoxy resin comprises up to 50% of a polyfunctional aliphatic epoxy resin and a polyfunctional aromatic epoxy resin for the remainder.

3. A flexible electrical laminate according to claim 2 wherein the polyfunctional epoxy resin comprises 10% to 30% by weight of a polyfunctional epoxy resin aliphatic epoxy resin.

* * * * *